US010884315B2

(12) United States Patent
Abel et al.

(10) Patent No.: US 10,884,315 B2
(45) Date of Patent: Jan. 5, 2021

(54) INTEGRATED OPTICAL TRANSMISSION ELEMENT

(71) Applicant: International Business Machines Corporation, Armonk, NY (US)

(72) Inventors: Stefan Abel, Zurich (CH); Paul F. Seidler, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 15/925,838

(22) Filed: Mar. 20, 2018

(65) Prior Publication Data

US 2019/0294021 A1    Sep. 26, 2019

(51) Int. Cl.
*G02F 1/29* (2006.01)
*G06N 3/06* (2006.01)
*G06N 3/067* (2006.01)
*G11C 13/04* (2006.01)

(52) U.S. Cl.
CPC ........... *G02F 1/293* (2013.01); *G06N 3/0675* (2013.01); *G11C 13/048* (2013.01); *G02F 2202/13* (2013.01)

(58) Field of Classification Search
CPC ....... G06N 3/0675; G11C 13/048; G02B 6/00
USPC .......................................................... 385/14
See application file for complete search history.

(56) References Cited

U.S. PATENT DOCUMENTS

| | | | | | |
|---|---|---|---|---|---|
| 4,626,075 A | * | 12/1986 | Chemla | .................. | B82Y 20/00 359/244 |
| 4,701,030 A | * | 10/1987 | Jewell | ..................... | G02F 3/024 359/243 |
| 4,767,196 A | * | 8/1988 | Jewell | ..................... | G02F 1/218 359/241 |
| 4,906,063 A | * | 3/1990 | Sato | ....................... | G02B 6/122 385/14 |
| 5,175,739 A | * | 12/1992 | Takeuchi | ............... | B82Y 20/00 372/21 |
| 5,353,262 A | * | 10/1994 | Yakymyshyn | ........... | G01H 9/00 340/566 |
| 5,958,761 A | * | 9/1999 | Yogev | .................... | C12M 21/02 435/257.1 |
| 6,684,008 B2 | * | 1/2004 | Young | .................... | B82Y 20/00 385/129 |

(Continued)

FOREIGN PATENT DOCUMENTS

WO    2010104956 A1    9/2010
WO    2014/060001 A1    4/2014

OTHER PUBLICATIONS

Adela-Diana Almasi et al. "Review of Advances in Neural Networks: Neural Design Technology Stack" Dec. 16, 2014.

(Continued)

*Primary Examiner* — Kaveh C Kianni
(74) *Attorney, Agent, or Firm* — Harrington & Smith

(57) ABSTRACT

An integrated optical transmission element may be provided. The integrated optical transmission element includes an optical cavity including an input port and an output port, and photorefractive material within the optical cavity. A transmission of light from the input port to the output port is persistently changeable by an optical control signal provided to the photorefractive material, the optical control signal being configured to change a refractive index.

12 Claims, 5 Drawing Sheets

(56) References Cited

U.S. PATENT DOCUMENTS

| | | | | |
|---|---|---|---|---|
| 6,697,548 | B2* | 2/2004 | LoCascio | G02F 1/3515 385/16 |
| 6,947,453 | B2* | 9/2005 | Sidorin | H01S 5/141 372/102 |
| 6,985,644 | B2* | 1/2006 | Andersen | H01S 5/026 385/12 |
| 2004/0208626 | A1 | 10/2004 | Nishimura | H04B 10/2537 398/161 |
| 2005/0200362 | A1* | 9/2005 | Yakymyshyn | G01R 1/071 324/501 |
| 2005/0200371 | A1* | 9/2005 | Yakymyshyn | G01R 15/241 324/754.23 |
| 2005/0201658 | A1* | 9/2005 | Yakymyshyn | G02F 1/035 385/12 |
| 2008/0029774 | A1* | 2/2008 | Shishov | H01L 33/501 257/96 |
| 2013/0141782 | A1* | 6/2013 | Theriault | G02B 3/14 359/368 |
| 2013/0148196 | A1* | 6/2013 | Arnold | G02B 21/025 359/385 |
| 2013/0297539 | A1* | 11/2013 | Piekniewski | G06N 3/049 706/20 |
| 2014/0125990 | A1* | 5/2014 | Hinderling | G02B 5/284 356/496 |
| 2014/0142664 | A1* | 5/2014 | Roukes | A61N 5/0622 607/88 |
| 2016/0227639 | A1* | 8/2016 | Kaminer | H05G 2/00 |
| 2017/0116514 | A1 | 4/2017 | Abel et al. | |
| 2017/0329201 | A1* | 11/2017 | Arnold | G02B 3/0087 |

OTHER PUBLICATIONS

Geoffrey W. Burr et al. "Experimental Demonstration and Tolerancing of a Large-Scale Neural Network (165000 Synapses) Using Phase-Change Memory as the Synaptic Weight Element" IEEE Transactions on Electron Devices, vol. 62, No. 11 Nov. 2015.

Ph. Dittrich, G. Montemezzani, P. Gunter "Tunable Optical Filter for Wavelength Division Multiplexing Using Dynamic Interband Photorefractive Gratings" accepted Oct. 28, 2002.

Takeo Sasaki "Dynamic Amplification of Optical Signals by Photorefractive Ferroelectric Liquid Crystals" http://dx.doi.org/10.5772/60776 [retreived Mar. 19, 2018].

Mable P. Fok, Yue Tian, David Rosenbluth and Paul R. Prucnal "Pulse Lead/Lag Timing Detection for Adaptive Feedback and Control Based on Optical Spike-Timing-Dependent Plasticity" Optics Letters vol. 38 No. 4 Feb. 15, 2013.

Behrad Gholipour et al. "Amorphous Metal-Sulphide Microfibers Enable Photonic Synapses for Brain-Like Computing" www.MaterialsViews.com, Dec. 10, 2014.

W.T. Rhodes et al. "Photorefractive Materials and Their Applications 3" Springer Series in Optical Sciences 2007. [retreived Aug. 2018].

Mitchell A. Nahmias et al. "A Leaky Integrate-and-Fire Laser Neuron for Ultrafast Cognitive Computing" IEEE Journal of Selected Topics in Quantum Electronics, vol. 19, No. 5, Sep./Oct. 2013.

M. Prezioso et al. "Training and Operation of an Integrated Neuromorphic Network Based on Metal-Oxide Memristors" Nature vol. 521. May 7, 2015.

Giacomo Indiveri et al. "Neuromorphic Silicon Neuron Circuits" Frontiers in Neuriscuebce [retreived Mar. 22, 2018].

Ivan K. Schuller and Rick Stevens "Neuromorphic Computing: From Materials to Systems Architecture" Report of a Roundtable Convened to Consider Neuromorphic Computing Basic Research Needs. Oct. 29-30, 2015.

Jeffrey Melrose, Ryan Perroy, Sylvana "Statewide Agricultural Land Use Baseline 2015" prepared for Hawaii Department of Agriculture [retreived Mar. 22, 2018].

Eric Vourch and Didier Herve "Microwave Photonic Photorefractive Smart Filters" Journal of Lightwave Technology, vol. 21, No. 12, Dec. 2003.

C. David Wright "Arithmetic and Biologically-Inspired Computing Using Phase-Change Materials" www.MaterialsViews.com [retrieved May 18, 2018].

"Silicon Photonic Neural Network Unveiled", MIT Technologoy Review, Nov. 2016, 3 pgs.

"Neural networks within multi-core optic fibers", Eyal Cohen, et al., Scientific Reports, Jul. 2016, 14 pgs.

"Computing by Means of Physics-Based Optical Neural Networks", A. Steven Younger et al., EPTCS 26, 2010, pp. 159-167.

* cited by examiner

500

502  guiding light from the input port to the output port through the cavity 504  changing the refractive index of the photorefractive material of the optical cavity

FIG. 5

INTEGRATED OPTICAL TRANSMISSION ELEMENT

FIELD OF THE INVENTION

The invention relates generally to an integrated optical transmission element, and more specifically, to an integrated optical transmission element to be used as optical synapse for a neural network. The invention relates further to a related optical synaptic link and a method for operating an integrated optical transmission element.

BACKGROUND

The traditional von-Neumann architecture for computer systems is more and more reaching its natural limitations. Computers based on the mentioned architecture typically comprise various units like main memory, communication units, as well as a control unit, an arithmetic/logic unit and some memory (together the CPU). The units comprise fixed logic with a clear set of instructions to be used for programming. Limitations are not only in the CPU itself but also in the data traffic between the memory and the processing units via data and instruction buses as well as new work-loads, like big data analysis, machine learning and similar technology fields. Most of those are characterized by large overheads caused by bringing data in and out of actual processing units.

Over the past years, more and more parallel computing (parallel CPU cores and/or parallel threads) has been used to address the physical limits and increase the compute power. However, it turned out that for specific classes of problems to be solved other architecture approaches may be more promising. Typical problem classes include image recognition, natural language processing and machine language translation, just to name a few. One of the predefined new architectures is a brain-inspired architecture. Basically, co-integrated memory units—representing artificial synapses—and processing units—representing artificial neurons—are used. Typically, the processing speed of the individual elements may be much lower compared to traditional computing approaches; however, also the power consumption per unit is much lower. On the other side, it may be required to have a very high interconnectivity rate between the artificial neurons (a fanout of about $10^4$). In contrast to classical computing approaches, these neural networks are not programmed in the procedural way, but the "programming" may be defined by synaptic states and neuron behavior which are built into the neural network by training, using a defined input and an expected output.

In the so-trained neural network the connections between the artificial neurons, i.e., the artificial synapses may carry each an individual, adaptable synaptic weight. An adjustment of the function of the neural network may be performed but algorithms configured to change the synaptic weight by e.g., back propagation. For example, a feed-forward neural network operates according to the principle of layer-by-layer signal processing with or without feedback loops, e.g., an input layer, a hidden middle layer and an output layer. In deep neural networks, a large number of different layers may be implemented. Other types of neural networks also exist, e.g., recurrent neural networks.

Basically, one may differentiate between three core elements of neural networks: neurons, connections and synapses. The neurons may collect input from dendrites—i.e., delivered output signals from other neurons—process the plurality of input signals and "fire" output signals via connections and synapses to other neurons. The connections may transmit and amplify the signals. They may also be responsible for a restoration of a signal shape. The synapses may be responsible for a signal transmission under a defined weight and carry—so to speak—parts of the learning of the neural network by synaptic weights. The synaptic weight may influence the intensity of a signal traveling from one neuron to another neuron.

Recently, integrated silicon photonic neuromorphic chips have been designed that prove that generally computers that compute at an ultrafast speed may be built. Photons allow significantly more bandwidth than electrical signals and thus, more data may be processed more quickly. Based on this, within the past few years, very fast optical neural network learning algorithms have been developed based on Fixed Weight Learning Neural Network technology. However, also neural networks based on that technology have their limitations and do not reach the flexibility and adaptability of their natural model, the human brain.

SUMMARY

According to one aspect of the present invention, an integrated optical transmission element may be provided. The optical transmission element may comprise an optical cavity comprising an input port and an output port and photorefractive material within the optical cavity. A transmission of light from the input port to the output port may be persistently changeable by an optical control signal provided to the photorefractive material. The optical control signal may be configured to change a refractive index of the photorefractive material.

According to another aspect of the present invention, an optical synaptic link for a neural network may be provided. The optical synaptic link may comprise a first optical neuron and a second optical neuron, and an optical synapse comprising the integrated optical transmission element according to the first aspect of the present invention. The input port of the optical transmission element may be optically connected to the first optical neuron and the output port of the optical transmission element may be optically connected to the second neuron.

According to a further aspect of the present invention, a method for operating an integrated optical transmission element may be provided. The integrated optical transmission element may comprise an optical cavity comprising an input port and an output port, and photorefractive material within the optical cavity. The method may comprise guiding light from the input port to the output port, and changing persistently a refractive index of the photorefractive material by an optical control signal.

BRIEF DESCRIPTION OF THE SEVERAL VIEWS OF THE DRAWINGS

It should be noted that embodiments of the invention are described with reference to different subject-matters. In particular, some embodiments are described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
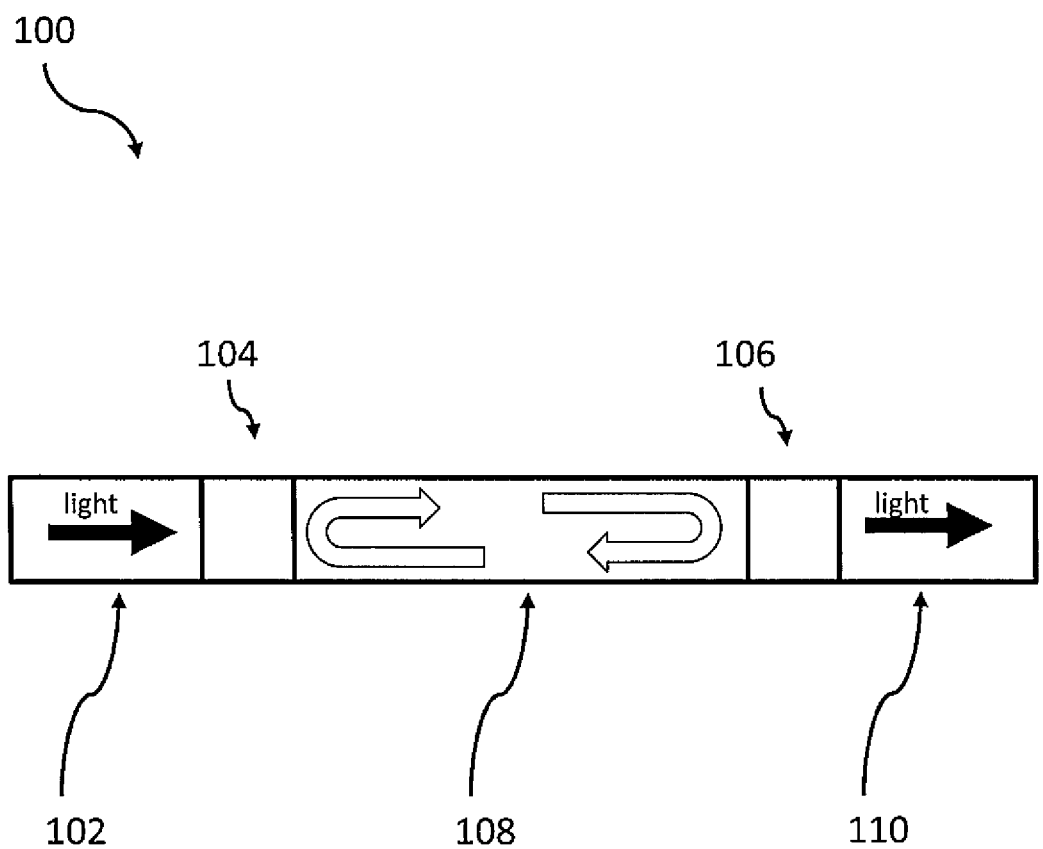

Preferred embodiments of the invention will be described, by way of example only, and with reference to the following drawings:

FIG. 1 shows a block diagram of an integrated optical transmission element in accordance with an example embodiment.

Figure 2:
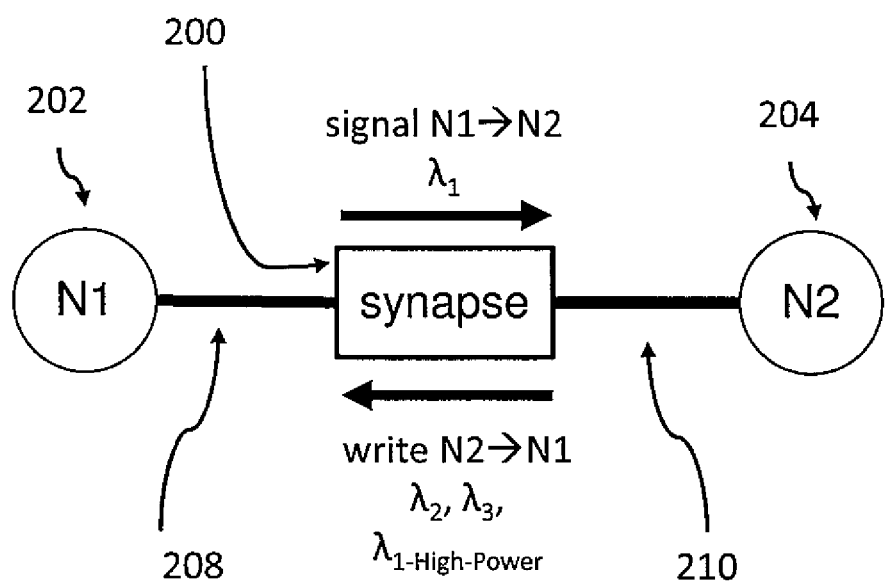

FIG. 2 shows a block diagram of an integrated optical transmission element used as optical synaptic element between two neurons in accordance with an example embodiment.

Figure 3:
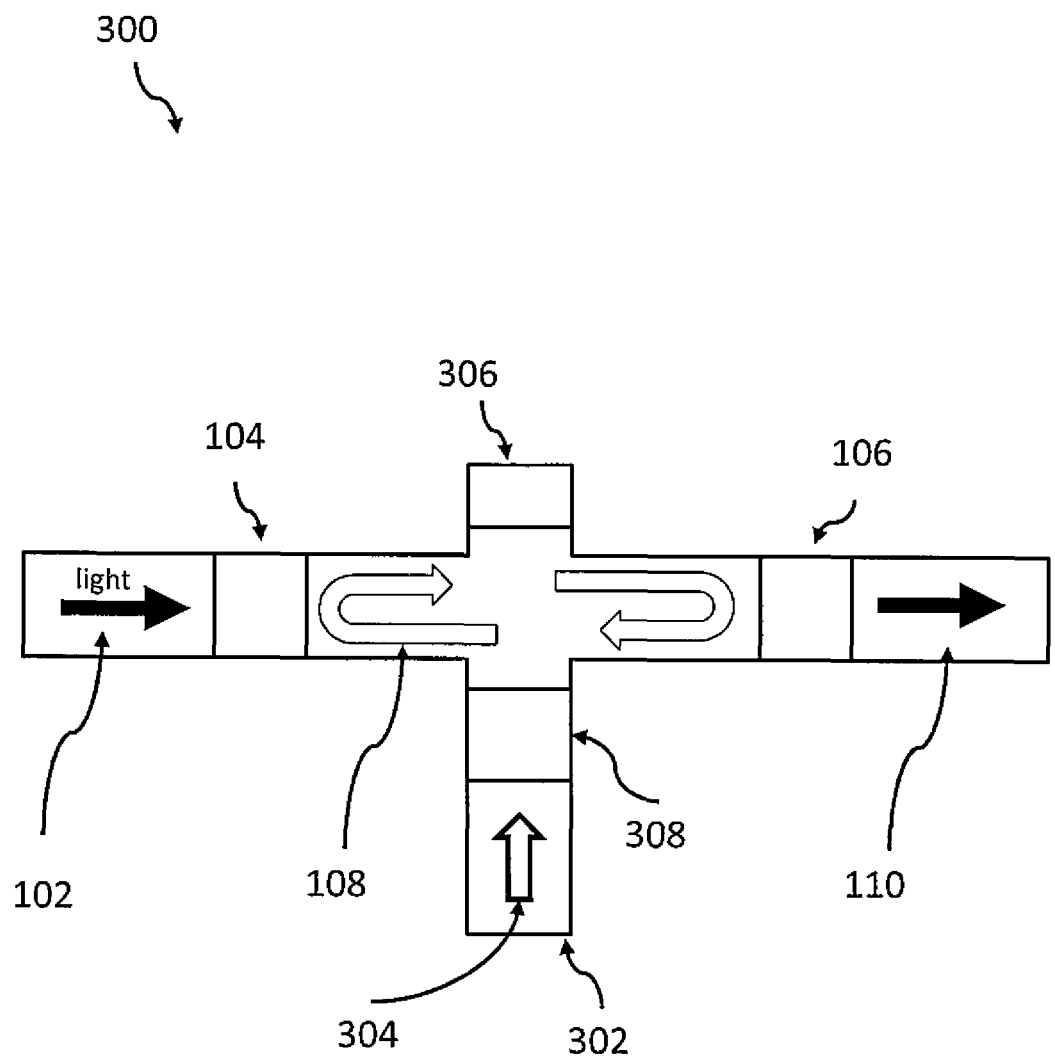

FIG. 3 shows a block diagram of an integrated optical transmission element with a dedicated control port in accordance with an example embodiment.

Figure 4:
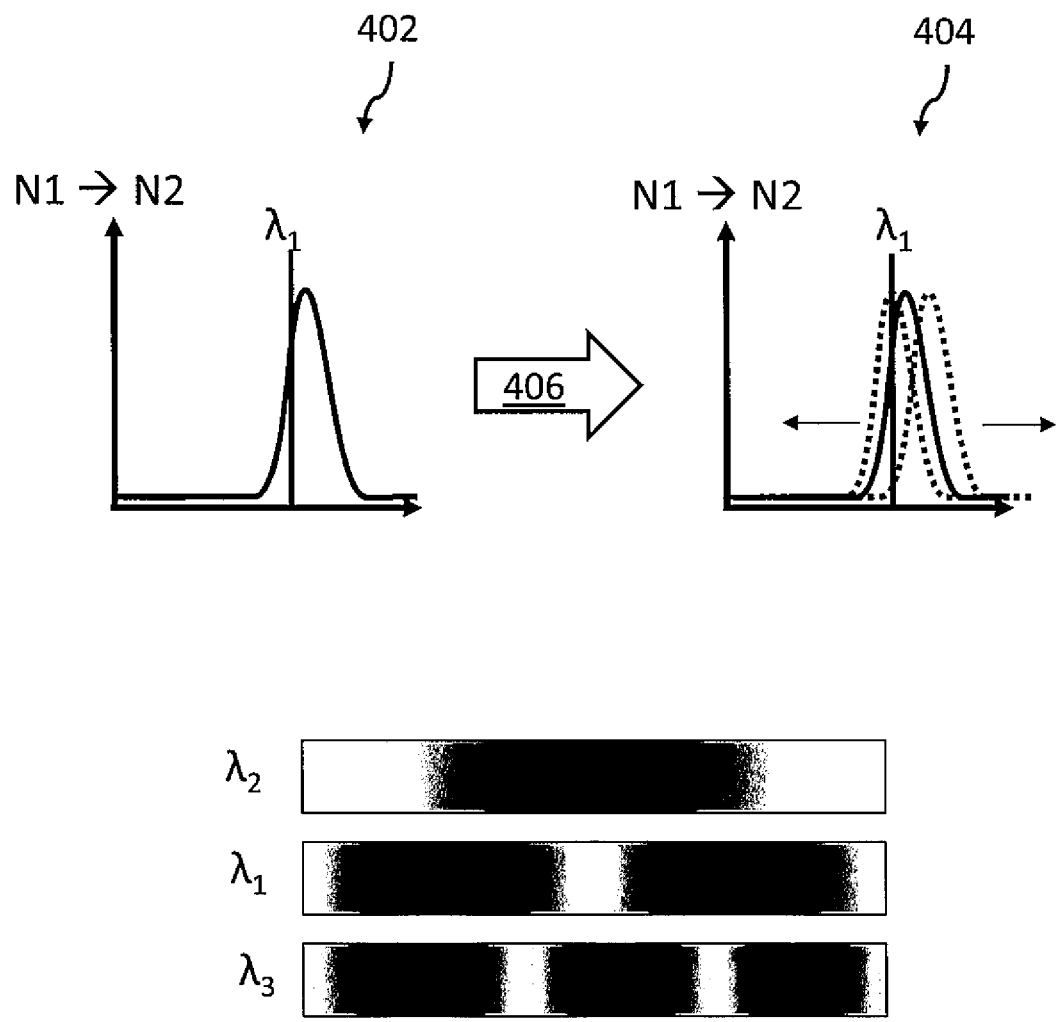

FIG. 4 shows the wavelength dependent behavior of photorefractive material in accordance with an example embodiment.

FIG. 5 shows a block diagram of a method for operating the integrated optical transmission element in accordance with an example embodiment.

DETAILED DESCRIPTION

In the context of this description, the following conventions, terms and/or expressions may be used:

The teen 'integrated' may denote an integration of different components and elements in the same sense as electronic devices may be integrated into a single chip. Here, the integration concept is related to waveguides, optical cavities, optical ports, and the like. It may be noted that the dimensions of the cross section of the optical waveguides—i.e., potentially integrating the input port and the output port—may be in the range of the used wavelength, e.g., about 500 nm to about 1.5 µm. This may represent a typical range of wavelength ranges of integrated photonics. However, it may be noted that the wavelength in the waveguide may be significantly different to the wavelength in vacuum due to the refractive index of the used material.

For a better understanding and categorization, it may also be mentioned that the power used for the different signals may be in the range of about 1 milliWatt or below. The lower the signal strengths becomes, the lower the overall power consumption and thus, a warming of a related artificial neural network becomes.

The term 'optical cavity' may denote a device of solid material for a defined wavelength range with semi-transparent/semi-reflective end ranges at which at least a predefined percentage of the light within the optical cavity may be reflected and kept inside the optical cavity.

The term 'input port' may denote an area in which light is entering the integrated optical transmission element. It may be implemented as an optical waveguide. Alternatively, the light beam of the incoming light may be directed directly to the optical cavity. In this case, one may speak of a virtual input port. The same understanding may be applied to the term 'output port'.

The term 'photorefractive material' may denote a material showing the photorefractive effect which is a nonlinear optical effect seen in certain crystals and other materials that respond to light by altering their refractive index. The photorefractive effect may occur through a generation of a non-uniform distribution of charge carriers by the electric field of the light in the photorefractive material. The charge carriers may be subject to a certain diffusion which may lead to a creation of a space charge field. This causes an electro-optic index modulation, i.e., a generation of a spatially varying refractive index due to the electric field generated by the charges and due to the electro-optical effect in the material.

The term 'optical control signal' may denote an optical signal different to the actively transmitted signal from the input port to the output port of the integrated optical transmission element. The optical control signal may be dedicated to changing the refractive index of the photorefractive material of the optical cavity. The wavelength of the optical control signal may be higher or lower than the wavelength of the transmitted light or, the wavelengths may be the same but the power of the light may be higher or lower than the transmitted light.

The term 'neural network'—or better artificial neural network—may denote computing systems inspired by the biological neural networks that constitute animal brains. Such systems may learn (progressively improve performance) to do tasks by considering examples, generally without task-specific programming. E.g., in image recognition, they might learn to identify images that contain cats by examining example images that have been manually labeled as "cat" or "no cat" and using the results to identify cats in other images. They have found most use in applications difficult to express in a traditional computer algorithm using rule-based programming.

An artificial neural network may be based on a collection of connected units called artificial neurons (the connections may be seen as being analogous to axons and dendrites in a biological brain). Each connection between neurons may transmit a signal to another neuron. The transmission between these neurons may be influenced by a synaptic element (synapse) which may be part of such a connection. The receiving (postsynaptic) neuron may process the signal(s) and then signal downstream neurons connected to it. Neurons may have state, generally represented by real numbers, typically between 0 and 1. Neurons and synapses may also have a weight that varies as learning proceeds, which may increase or decrease the strength of the signal that it sends downstream. Further, they may have a threshold such that only if the aggregate signal is below (or above) that level the downstream signal is sent.

The term 'optical neuron' may denote an artificial neuron in the sense of an artificial neural network working with optical signals. They may be integrated in the form of a leaky integrate-and-fire element and may sum-up incoming—i.e., artificial dendrite—signals. The leakage may be critical to set a time-dependence for the spiking of the neuron. This may often be approximated by a "threshold behavior", e.g., the sum of the input signals plus a nonlinear function.

The term 'optical synapse' may denote an artificial synapse in the sense of an artificial neural network operating with optical signals. Thus, it may be seen as a connection element between a first artificial neuron and a second artificial neuron working with optical signals.

The term 'optically connected' may denote a situation in which a light wave—i.e., photons—may pass from one element to another element to which it may be connected. The connection may be achieved by a physical element—e.g., a waveguide or a glass fiber—between the two elements. It may also be an optical cavity.

The term 'optical feedback pulse' may denote an optical signal in an optical artificial neural network being sent back from a second optical neuron. In certain algorithms for artificial neural networks, the optical feedback pulse may be used for back propagation during the learning phase of the neural network.

The proposed integrated optical transmission element may offer multiple advantages and technical effects:

The transmission of an integrated optical transmission element may be controlled by another optical signal. Thus, artificial synapses may be built having a variable adjustable weight—or weight factor—if used as a connection element between two artificial optical neurons. This way, not only fixed weight artificial synapses and related neuronal networks may be implemented, but optical neuronal networks whose behavior may be much closer to those of their natural counterparts.

The usage of photorefractive material in a cavity of the integrated optical transmission element may allow to control actively and predictably a percentage of light passing through the artificial synapse. The photorefractive effect used may persist indefinitely or may diminish over time, i.e., be transient or leaky. This way, also leaky integrate-and-fire behaviors may be simulated successfully in optical artificial neural networks.

It may also be noted that the overall power consumption of optical neural networks is expected to be much lower than those operating with electronic devices. In order to increase the density of artificial neural networks, it has been essential to find a practical way for controlling weight factors in artificial optical synapses.

In the following, additional embodiments of the integrated optical transmission element—also applicable to the optical synaptic element and the related method—will be described:

According to one advantageous embodiment of the integrated optical transmission element, the optical control signal, having a first wavelength different—either higher or lower depending on the photorefractive material—to the wavelength of the transmitted light may cause an increase of the transmitted light. This may be achieved by the change of the refractive index of the photorefractive material within the optical cavity. A higher or lower order mode may be excited in the cavity by the optical control signal, thus influencing the percentage of transmitted light through the optical transmission element.

According to another advantageous embodiment of the integrated optical transmission element, the optical control signal having a second wavelength different—again, either higher or lower depending on the photorefractive material—to the wavelength of the transmitted light, may cause a decrease of the transmitted light. The resulting effect may be to reverse the effect described above in the context of the first wavelength, i.e. the previous increase of transmitted light is reversed.

According to a further advantageous embodiment of the integrated optical transmission element, the optical control signal having the same wavelength as the wavelength of the transmitted light—also denoted as read out light—and a higher power than the transmitted light may cause a decrease or an increase of the transmitted light. Also here, through the higher power of the optical control signal, the refractive index of the photorefractive material may be changed influencing the percentage of transmitted light.

According to one permissive embodiment of the integrated optical transmission element, the optical control signal may excite a higher or lower order mode in the optical cavity, different to the mode excited by the transmitted light which causes the increase or decrease of transmission from the input port to the output port.

According to one preferred embodiment of the integrated optical transmission element, the change of the refractive index may be spatially inhomogeneous within the photorefractive material. The spatial distribution of the change in refractive index in the photorefractive material caused by the optical control signal may be instrumental in changing the transmission of the transmitted light.

According to one allowable embodiment of the integrated optical transmission element, the input port and the output port may be identical. Thus, the optical transmission element may also work in a reflective implementation. Thus, only one input/output port would be required.

According to one additionally advantageous embodiment of the integrated optical transmission element, the optical control signal may be guided to the photorefractive material via a control port. Hence, the angle under which the optical control signal is guided into the photorefractive material is independent of the direction of propagation of the incoming or outgoing transmitted light beam through the optical transmission element. It may come from a side of the optical transmission element or from above or below the optical transmission element under any angle.

According to another permissive embodiment of the integrated optical transmission element, the control port may be identical to either the input port or, the output port or may be a dedicated control port different to the input port and the output port. This feature may offer greater design flexibility for the integrated optical transmission element. It is not mandatory to use a dedicated control port—as explained above—the port of the incoming or the outgoing light may also be used for the optical control signal.

According to a preferred embodiment of the integrated optical transmission element, the optical cavity may be a linear optical cavity or an optical ring resonator with an associated bus waveguide. The bus waveguide may be the one used for the light transmission from the input port to the output port. In this case, the material of the ring resonator, or parts thereof, may be formed by the photorefractive material. Consequently, also the optical control signal may be directed to the ring resonator.

According to a further useful embodiment, the integrated optical transmission element may comprise more than one control port. Consequently, optical control signals with a different wavelength than the active transmitted signal and optical control signals with a higher power than the active transmitted signal may be guided to the photorefractive material using dedicated control ports.

According to one additionally preferred embodiment of the integrated optical transmission element, the photorefractive material is selected out of the group comprising $BaTiO_3$, $LiNbO_3$, $ZnTe:V$, $Pb[Zr_xTi_{1-x}]O_3$, $GaAs$, $KNbO_3$, $LiTaO_3$, $Sn_2P_2S_6$, $SrTiO_3$, a complex oxide, a transmission metal oxide, a semiconductor, a phase change material—e.g., $TiN$, $GeSbTe$ [GST]—$VO_2$, materials with varying refractive index when changing the stoichiometry like $SrTiO_3$ with variable oxygen vacancy concentration, organic photorefractive materials and quantum well structures. It may also be understood that any other materials that may be changeable to optical signals may be useful for the inventive concept.

According to an advantageous embodiment of the optical synaptic link a power of transmitted light from the first optical neuron to the second optical neuron may be increased or decreased by an optical feedback pulse from the second optical neuron to the first optical neuron, wherein the optical feedback pulse is guided by a control port to the photorefractive material. The optical feedback pulse may be seen as equivalent to the optical control signal. In certain algorithms for neural networks, it may be seen as a signal of back propagation during the learning or training phase of the neural network elements.

It may also be noted that the three options mentioned above for guiding the optical feedback signals into the photorefractive material may also be applicable here: via the input port—i.e., from the same direction as the first neuron—via the direction of the output port—i.e., from the same direction as the second neuron—or via a dedicated control port.

According to another possible embodiment of the optical synaptic link—and equivalently to the integrated optical transmission element—the optical feedback pulse may have a different wavelength than the light transmitted from the input port optically, connected to the first optical neuron, to the output port, optically connected to the second optical neuron.

According to a further embodiment of the optical synaptic link, the optical feedback pulse may have the same wavelength but a higher intensity than the light transmitted from the first optical neuron to the second optical neuron. Also, this should be seen as an equivalent feature if compared to the integrated optical transmission element.

In the following, a detailed description of the figures will be given. All instructions in the figures are schematic. Firstly, a block diagram of an embodiment of the inventive integrated optical transmission element is given. Afterwards, further embodiments, as well as embodiments of the optical synaptic element and the method for operating an integrated optical transmission element, will be described.

FIG. 1 shows a block diagram of an integrated optical transmission element 100 in accordance with an example embodiment. The integrated optical transmission element 100 comprises an optical cavity 108, an optical input port 102 and an optical output port 110. The incoming light may be guided by a waveguide to the input port 102. The same may apply for the outgoing light at the other end of the optical transmission element 100. However, it may be mentioned that the inventive concept may also work if the optical cavity 108 may have no physical connection to an incoming or outgoing waveguide. In this case, the transmission beam would simply be directed at the optical transmission element 100 photorefractive material.

The optical cavity 108 comprises photorefractive material or is made of photorefractive material. At the left end and the right end of the optical cavity 108 reflection zones 104,106 are shown. They may be implemented as a reflection lattice—i.e., a Bragg reflector or photonic crystal—wherein the lattice dimensions are configured to the wavelength of the transmitted light. The characteristic of the optical cavity 108 may be indicated by the bowed arrows within the optical cavity 108.

The transmission of light from the input port 102 to the output port 110 is persistently changeable by the optical control signal provided to the photorefractive material. This is performed by the optical control signal which is changing the refractive index of the photorefractive material in the optical cavity 108. It may be noted that the optical control signal may have the same or a different wavelength than the actively transmitted signal from the input port 102 to the output port 110.

It may be understood that the reflection zones 104,106 may be implemented in any form of reflective material, like a thin semitransparent metal layer or a transition from one material with one refractive index to another material having another refractive index. As a rule of thumb, between 10% and 99% percent of the transmitted light are transmitted through the integrated optical transmission element. However, the actual percentage may be influenced by the optical control signal (not shown here) and the actual status of the photorefractive material.

It may also be noted that the refractive index of the photorefractive material may have a real and an imaginary component (in the mathematical sense). It may be of an advantageous practical use if only the real component of the photorefractive material is changed by the optical control signal.

According to another optional embodiment of the integrated optical transmission element, the optical cavity may be a photonic crystal cavity. It may also comprise photonic crystal waveguides connected to the input port, output port and control port. In this case, the material of the photonic crystal or parts thereof may be formed by the photorefractive material.

FIG. 2 shows a block diagram of an integrated optical transmission element 100 used as optical synapse 200 in accordance with an example embodiment. Light of a wavelength $\lambda_1$ coming from a first optical neuron 202 may be guided by a waveguide 208 to the optical synapse 200. From the optical synapse 200, the light is guided again by a waveguide 210 to a second optical neuron 204. The transmission of light from the first neuron 202 to the second neuron 204 may be influenced by the transmission of the synapse 200. The transmission may be influenced by an optical control signal which may be symbolized by the arrow going from the right side to the left side of FIG. 2 below the synapse 200. The optical control signal may have a lower or a higher wavelength—i.e., $\lambda_2, \lambda_3$—if compared to the transmitted light. Alternatively, the wavelength of the transmitted light and the wavelength of the optical control signal may have the same wavelength $\lambda_3$. However, in this case, the power of the optical control signal with a wavelength of the transmitted light may be higher (or lower) than the transmitted optical signal.

The direction of the control signal going from the right side to the left side may be seen as exemplary. As indicated above, it may also come from the left side or any other angle as long as it is reaching the photorefractive material.

FIG. 3 shows another implementation of an integrated optical transmission element 300 with a dedicated control port in accordance with an example embodiment. The general concept of the input port 102 and the output port 110 between which the optical cavity 108 with the photorefractive material is positioned remains basically unchanged. However, a dedicated control port 302 is also connected to the optical cavity 108, and in particular to the photorefractive material. Although the direction of the optical control signal 304 is shown perpendicular to the light transmitted through the integrated optical transmission element 300, any angle between the two light signals may be chosen (also in three-dimensional space).

In a concrete implementation, the control signal 304 may come from any side—in particular also from above or below—of the optical cavity 108. It may also be noted that the control port 302 may not be implemented as a waveguide connection but a light beam may be directed to the optical cavity 108 directly.

The reflection zones 306 and 308 may have a higher reflectivity than the reflection zones 104 and 106. Actually, the reflection zone 306 may be implemented as being 100% reflective, whereas the reflection zone 308 may let light from the optical control signal 304 pass into the photorefractive material.

Another useful effect may be that the optical signal 304—not only in this embodiment but in general—may heat up the photorefractive material such that the induced change of the refractive index may persist a long time or forever after exposure of the photorefractive material to the optical control signal 304. It may be remembered that the optical control signal may only be a pulse of a predefined duration such that the extent of the change of the refractive index may be controlled in tight boundaries. It may also be advantageous if the duration of the change of the refractive index may not be permanent but transient, i.e., leaky or fading out over time. This way, leaky integrate-and-fire artificial neurons may be implemented elegantly.

FIG. 4 shows the effect happening in the photorefractive material as well as the consequences for the transmitted light through an integrated optical transmission element in accordance with an example embodiment. The left diagram 402 shows the wavelength $\lambda_1$ of the transmitted light, as well as the percentage of light passing through from the input port to the output port, i.e., from the first neuron N1 to the second neuron N2. The peak in the transmission is a consequence of the design of the optical cavity.

If an optical control signal is guided to the photorefractive material of the optical cavity, the dip in the transmissibility is shifted either to the left or to the right in terms of relative to the wavelength, as indicated by the arrows in the diagram 404. Because the wavelength $\lambda_1$ of the transmitting light remains unchanged, the percentage of light passing through the integrated optical element or the optical synaptic element increases or decreases. The x-axis shows the wavelength and the y-axis shows the intensity of the transmission signal.

In the lower part of FIG. 4, the different modes according to the different wavelengths $\lambda_1$, $\lambda_2$ or $\lambda_3$ are shown. It may also be understood that an optical control signal having the same wavelength $\lambda_1$ as the transmitted light but a higher power may be used. The arrow 406 may indicate that an optical control signal may have been received in form of a light pulse or feedback pulse such that the refractive index of the photorefractive material is changed persistently (or transiently).

This effect may advantageously be used for assigning different weight factor values to the connection between the first and a second neuron such that optical synapses having different weight factor values may become implementable.

FIG. 5 shows a block diagram of a method 500 for operating an integrated optical transmission element in accordance with an example embodiment. Also here, the integrated optical transmission element comprises an optical cavity comprising an input port and an output port. Additionally, photorefractive material is positioned within the optical cavity or represents the optical cavity.

The method comprises guiding, 502, light from the input port to the output port, and changing, 504, persistently the refractive index of the photorefractive material by an optical control signal.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowcharts and/or block diagrams in the Figures illustrate the architecture, functionality, and operation of possible implementations of systems, methods, and potentially computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. An integrated optical transmission element, the optical transmission element comprising:
   an optical cavity comprising an input port and an output port; and
   photorefractive material within the optical cavity,
   wherein transmission of light from the input port to the output port is persistently changeable by an optical control signal provided to the photorefractive material, the optical control signal being introduced to change a refractive index of the photorefractive material, the change in the refractive index persisting indefinitely following reception of the optical control signal.

2. The integrated optical transmission element according to claim 1, wherein the optical control signal, having a first wavelength different from the wavelength of the light being transmitted from the input port to the output port, causes an increase in the transmitted light.

3. The integrated optical transmission element according to claim 1, wherein the optical control signal, having a second wavelength different from the wavelength of the light being transmitted from the input port to the output port, causes a decrease in the transmitted light.

4. The integrated optical transmission element according to claim 1, wherein the optical control signal, having the same wavelength as and a higher power than the light being transmitted from the input port to the output port causes a decrease or an increase in the transmitted light.

5. The integrated optical transmission element according to claim 1, wherein the optical control signal excites a higher or lower order mode in the cavity different from a mode excited by the transmitted light.

6. The integrated optical transmission element according to claim 1, wherein the change of the refractive index is spatially inhomogeneous within the photorefractive material.

7. The integrated optical transmission element according to claim 1, wherein the input port and the output port are the same port.

8. The integrated optical transmission element according to claim 1, wherein the optical control signal is guided to the photorefractive material via a control port.

9. The integrated optical transmission element according to claim 8, wherein the control port is one of the input port and the output port or is a dedicated port different from the input port and the output port.

10. The integrated optical transmission element according to claim 1, further comprising more than one control port.

11. The integrated optical transmission element according to claim 1, wherein the optical cavity is a linear optical cavity or a ring resonator with an associated bus waveguide.

12. The integrated optical transmission element according to claim 1, wherein the photorefractive material is selected out of the group comprising $BaTiO_3$, $LiNbO_3$, ZnTe:V, $Pb[Zr_xTi_{1-x}]O_3$, GaAs, $KNbO_3$, $LiTaO_3$, $Sn_2P_2S_6$, $SrTiO_3$, a complex oxide, a transmission metal oxide, a semiconductor, a phase change material, an organic photorefractive material and a quantum well structure.

* * * * *